United States Patent
Mishima et al.

(10) Patent No.: US 9,728,658 B2
(45) Date of Patent: Aug. 8, 2017

(54) SOLAR CELL MODULE

(75) Inventors: Takahiro Mishima, Kobe (JP); Hitoshi Sakata, Kobe (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 688 days.

(21) Appl. No.: 12/509,137

(22) Filed: Jul. 24, 2009

(65) Prior Publication Data

US 2010/0031999 A1   Feb. 11, 2010

(30) Foreign Application Priority Data

Aug. 8, 2008 (JP) ................................ 2008-205878

(51) Int. Cl.
  *H01L 31/00* (2006.01)
  *H01L 31/0224* (2006.01)
  *H01L 31/05* (2014.01)

(52) U.S. Cl.
  CPC .. *H01L 31/022433* (2013.01); *H01L 31/0516* (2013.01); *Y02E 10/50* (2013.01)

(58) Field of Classification Search
  CPC ..... H01L 31/022433; H01L 31/022441; H01L 31/0516; Y02E 10/50
  USPC .......................... 136/251, 255, 256, 259, 244
  See application file for complete search history.

(56) References Cited

U.S. PATENT DOCUMENTS

| | | | | |
|---|---|---|---|---|
| 5,973,260 A | * | 10/1999 | Tange | ............. H01L 31/035281 126/698 |
| 2005/0172996 A1 | * | 8/2005 | Hacke et al. | ................. 136/256 |
| 2008/0216887 A1 | * | 9/2008 | Hacke et al. | ................. 136/244 |

FOREIGN PATENT DOCUMENTS

| | | |
|---|---|---|
| JP | 2005-011869 A | 1/2005 |
| WO | 2008/080160 A1 | 7/2008 |
| WO | 2009-025147 A1 | 2/2009 |

* cited by examiner

*Primary Examiner* — Thanh-Truc Trinh
(74) *Attorney, Agent, or Firm* — Mots Law, PLLC

(57) ABSTRACT

A first solar cell is electrically connected to a second solar cell electrically and arranged in an array direction. Each of the first and second solar cell comprises: a light-receiving surface; a rear surface; a plurality of n-type side electrodes and p-type side electrodes both formed in the array direction on the rear surface; a wiring member electrically connecting the first solar cell and the second solar cell and arranged over the plurality of n-type side electrodes and the plurality of p-type side electrodes; an n-type side electrode insulating member that is arranged over the wiring member and covers a part of the plurality of n-type side electrodes, the part facing the wiring member; and a p-type side electrode insulating member that is arranged over the wiring member and covers a part of the plurality of p-type side electrodes, the part facing the wiring member.

11 Claims, 12 Drawing Sheets

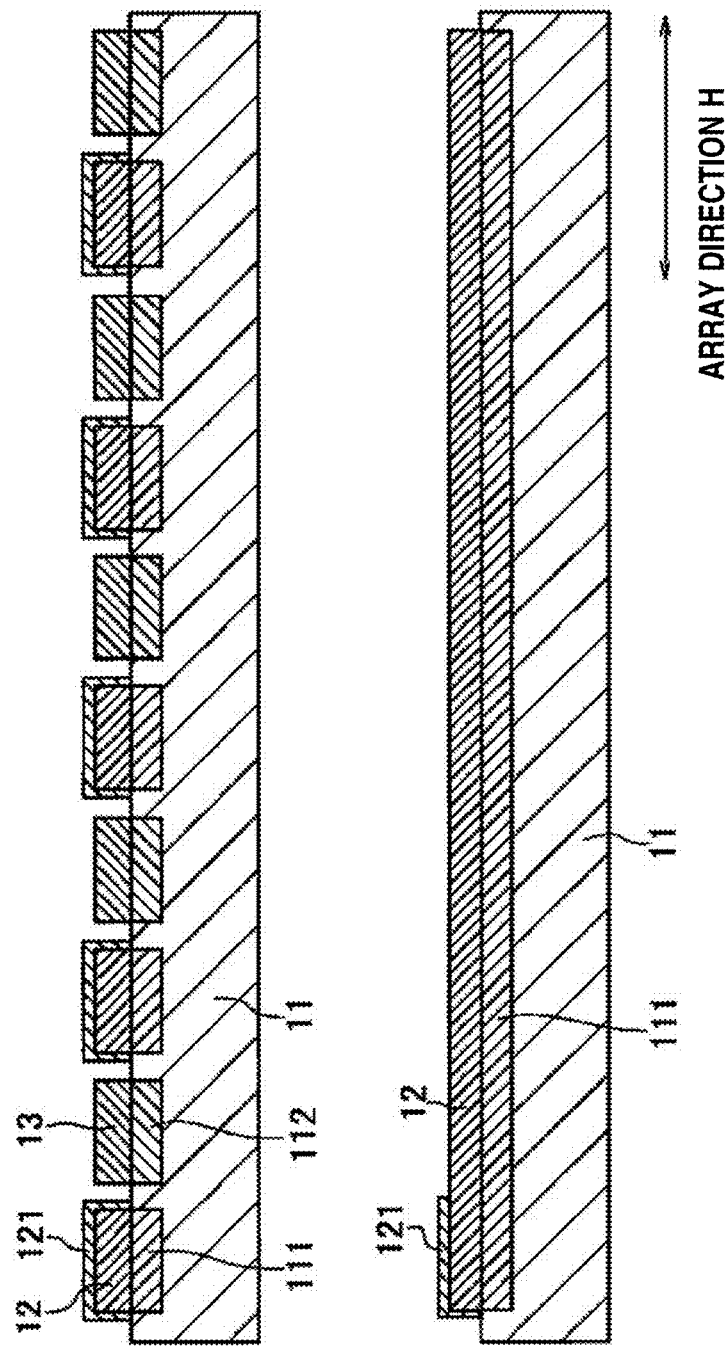

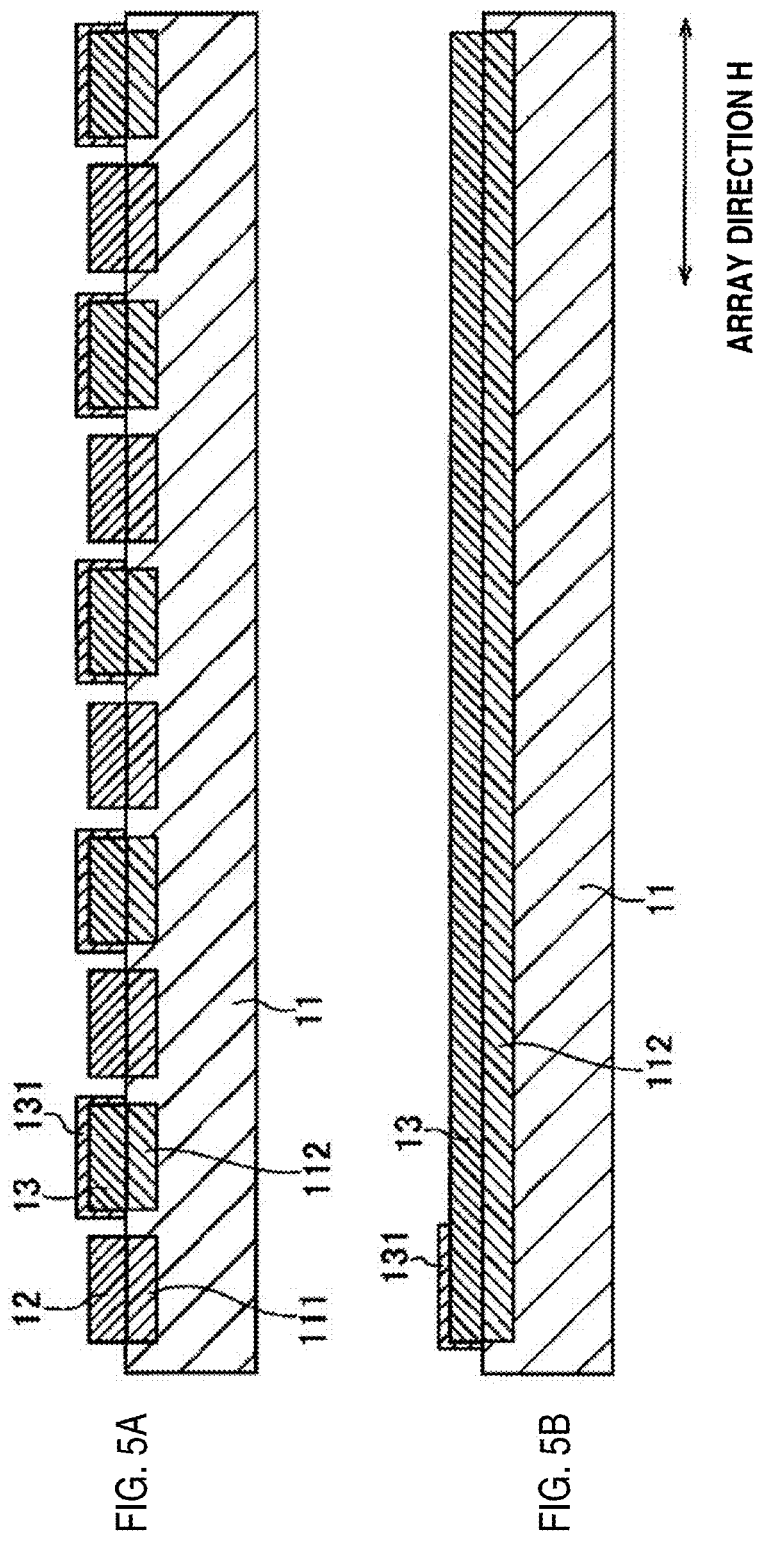

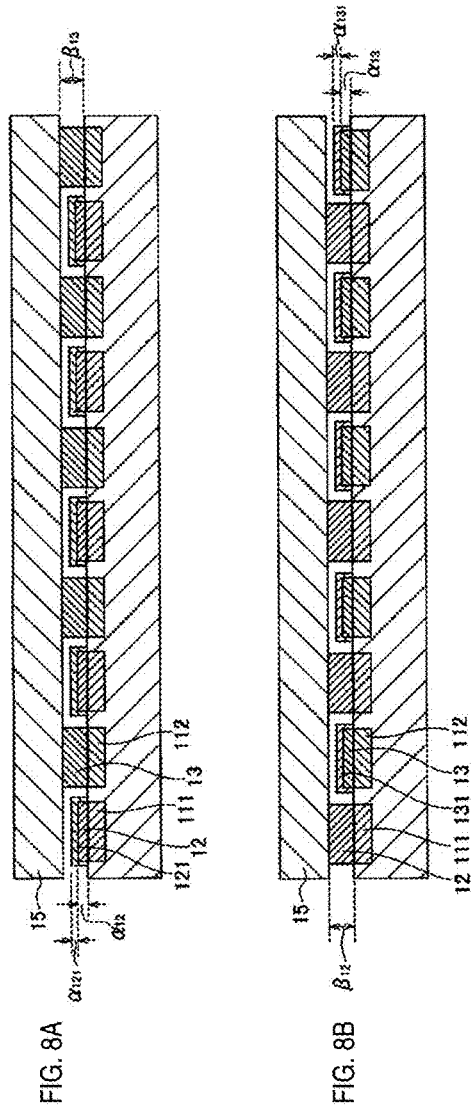

SOLAR CELL MODULE

CROSS REFERENCE TO RELATED APPLICATIONS

This application claims priority based on 35USC119 from prior Japanese Patent Application No. P2008-205878 filed on Aug. 8, 2008, entitled "SOLAR CELL MODULE", the entire contents of which are incorporated herein by reference.

BACKGROUND OF THE INVENTION

1. Field of the Invention

The invention relates to a solar cell module including back junction solar cell.

2. Description of Related Art

A solar cell is considered as a new prospective source of energy because it can convert clean and inexhaustible supply of sunlight directly into electricity. Each solar cell can often produce only about a few watts of power. Hence, a solar cell module is used when solar cells are utilized to supply electrical power (energy source) to residential homes or buildings. A solar cell module is created by connecting individual solar cells electrically in order to increase electrical power output.

Here, Japanese Patent Laid-Open No. 2005-11869 discloses and brings forward a type of so-called back junction solar cell. Aiming to expand light-receiving dimensions, it has a plurality of n-doped regions and a plurality of p-doped regions on the back side of a semiconductor substrate arranged in stripe configuration. An n-type side thin wire electrode is formed on each n-doped region, and a p-type side thin wire electrode is formed on each p-doped region. Each n-type side thin wire electrode is connected to an n-type side connecting electrode formed on one side of the edge on the rear surface, and each p-type side thin wire electrode is connected to a p-type side connecting electrode formed on one side of the edge on the rear surface. By connecting n-type side connecting electrode of one solar cell and p-type side connecting electrode of another solar cell adjacent to the above-mentioned one solar cell by wiring member, one solar cell and another solar cell are connected electrically.

However, in the region of the back side of semiconductor substrate, wherein n-type side connecting electrode and p-type side connecting electrode are arranged, low collection efficiency of photogenerated carriers (electron or positive hole) has been a problem.

SUMMARY OF THE INVENTION

An aspect of the invention provides a solar cell module that comprises: a first solar cell; a second solar cell electrically connected with the first solar cell and placed in an array direction with the first solar cell, wherein the first solar cell and the second solar cell each comprise: a light-receiving surface; a rear surface arranged on a back side of the light-receiving surface; a plurality of n-type side electrodes formed in the array direction on the rear surface; a plurality of p-type side electrodes formed in the array direction on the rear surface; a wiring member electrically connecting the first solar cell and the second solar cell and arranged over the plurality of n-type side electrodes and the plurality of p-type side electrodes; an n-type side electrode insulating member that is arranged over the wiring member and covers apart of the plurality of n-type side electrodes, the part facing the wiring member; and a p-type side electrode insulating member that is arranged over the wiring member and covers a part of the plurality of p-type side electrodes, the part facing the wiring member.

In the abovementioned solar cell module, each n-type side electrode in the first solar cell and wiring member are electrically separated and each p-type side electrode within the second solar cell and wiring member are electrically separated. Hence, each p-type side electrode in the first solar cell and each n-type side electrode in the second solar cell can be connected electrically by wiring member. Therefore, it is not necessary to place a connecting electrode in order to connect to wiring member in each solar cell. Thus, it can prevent degradation of collection efficiency of photogenerated carriers.

It is preferred that the thickness of respective parts facing the wiring member of the plurality of n-type side electrodes in the first solar cell is thinner than the thickness of respective parts facing the wiring member of the plurality of p-type side electrodes in the first solar cell.

It is preferred that the thickness of respective parts facing the wiring member of the plurality of p-type side electrodes in the second solar cell is thinner than the thickness of respective parts facing the wiring member of the plurality of n-type side electrodes in the second solar cell.

Another aspect of the invention provides a solar cell module that comprises: a first solar cell; a second solar cell electrically connected with the first solar cell and placed in an array direction with the first solar cell; wherein the first solar cell and the second solar cell each comprise: a light-receiving side; a rear surface arranged on an opposing side from the light-receiving side; an n-type side electrode formed in the array direction on the rear surface; a p-type side electrode formed in the array direction on the rear surface; a wiring member electrically connecting the first solar cell and the second solar cell and arranged over the n-type side electrode and the p-type side electrode; an n-type side electrode insulating member that is arranged over the wiring member and covers a part of n-type side electrode, the part facing the wiring member; and a p-type side electrode insulating member that is arranged over the wiring member and covers a part of the p-type side electrode, the part facing the wiring member.

BRIEF DESCRIPTION OF THE DRAWINGS

FIG. 4A is a cross-sectional view taken along sectional line M-M of FIG. 3. FIG. 4B is a cross-sectional view taken along sectional line N-N of FIG. 3.

FIG. 5A is a cross-sectional view taken along sectional line O-O of FIG. 3. FIG. 5B is a cross-sectional view taken along sectional line P-P of FIG. 3.

FIG. 8A is a cross-sectional view taken along sectional line L-L of FIG. 2. FIG. 8B is a cross-sectional view taken along sectional line K-K of FIG. 2.

DETAILED DESCRIPTION OF EMBODIMENTS

Figure 1:
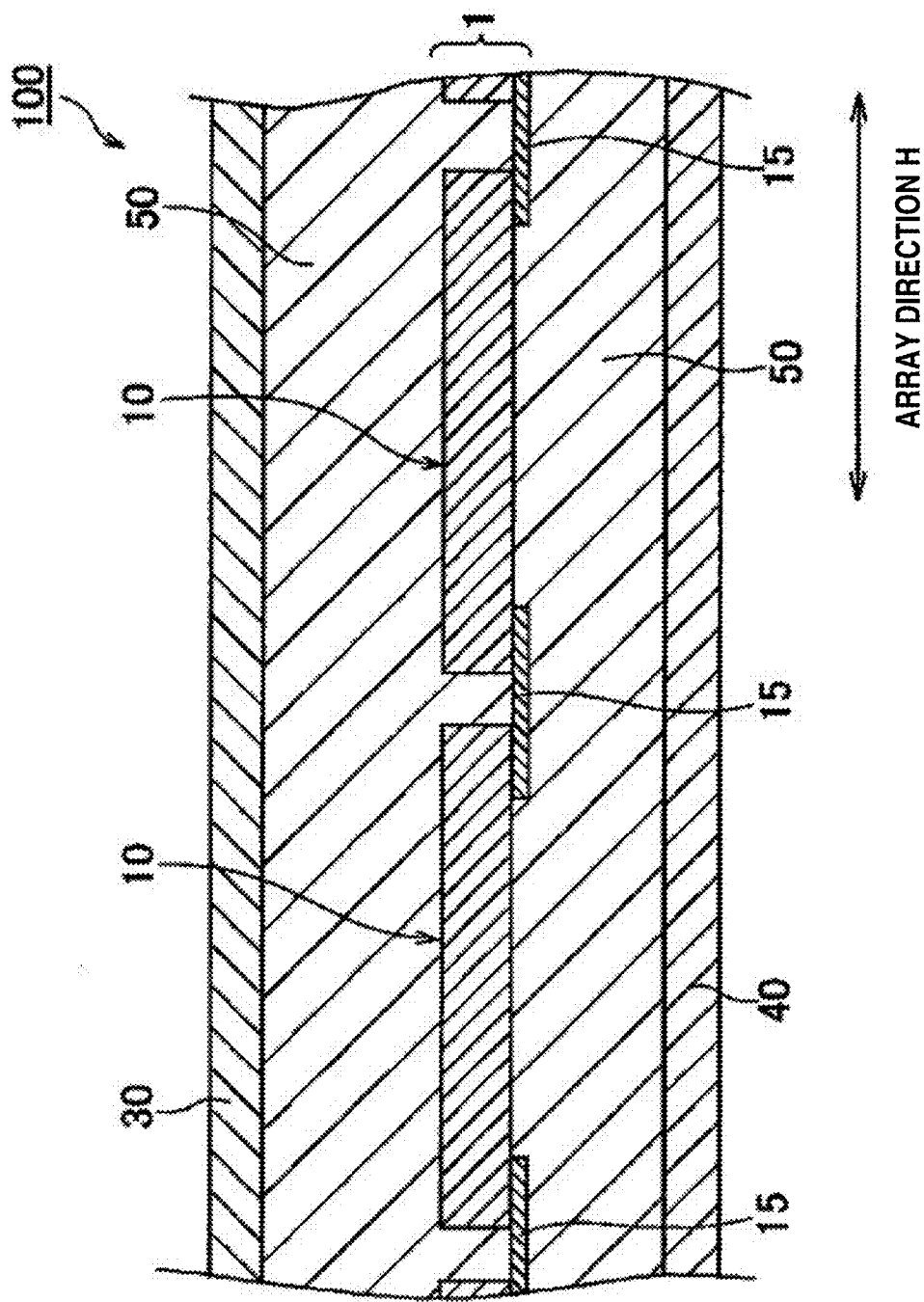
FIG. 1 is a side view illustrating a configuration of solar cell module 100 of a first embodiment.

Next, embodiments are described below with reference to the accompanying drawings. In the following description, parts or units that are identical or similar to each other across the embodiments are given identical or similar reference numerals. In this regard, however, the drawings are schematic diagrams and one should keep in mind that proportions of respective dimensions differ from those in actual embodiments. Hence, one should take the following description into consideration and judge actual dimensions and such. Furthermore, as for relationships between drawings, it is obvious that respective dimensions and proportions also can be different.

Here, the prepositions "on", "over" and "above" are defined by the relationship to the surface of the member and the direction of the surface in space does not relate to them. Preposition "above" may be used when a member is in contact with other member in specifications or claims. Preposition "on" may be used when one member is not in contact with another member, for example, there is an intervening member between two members. Also, preposition "on" may be used when two members are attached as well as when they are not attached to each other.

(Configuration of a Solar Cell Module)

Figure 2:
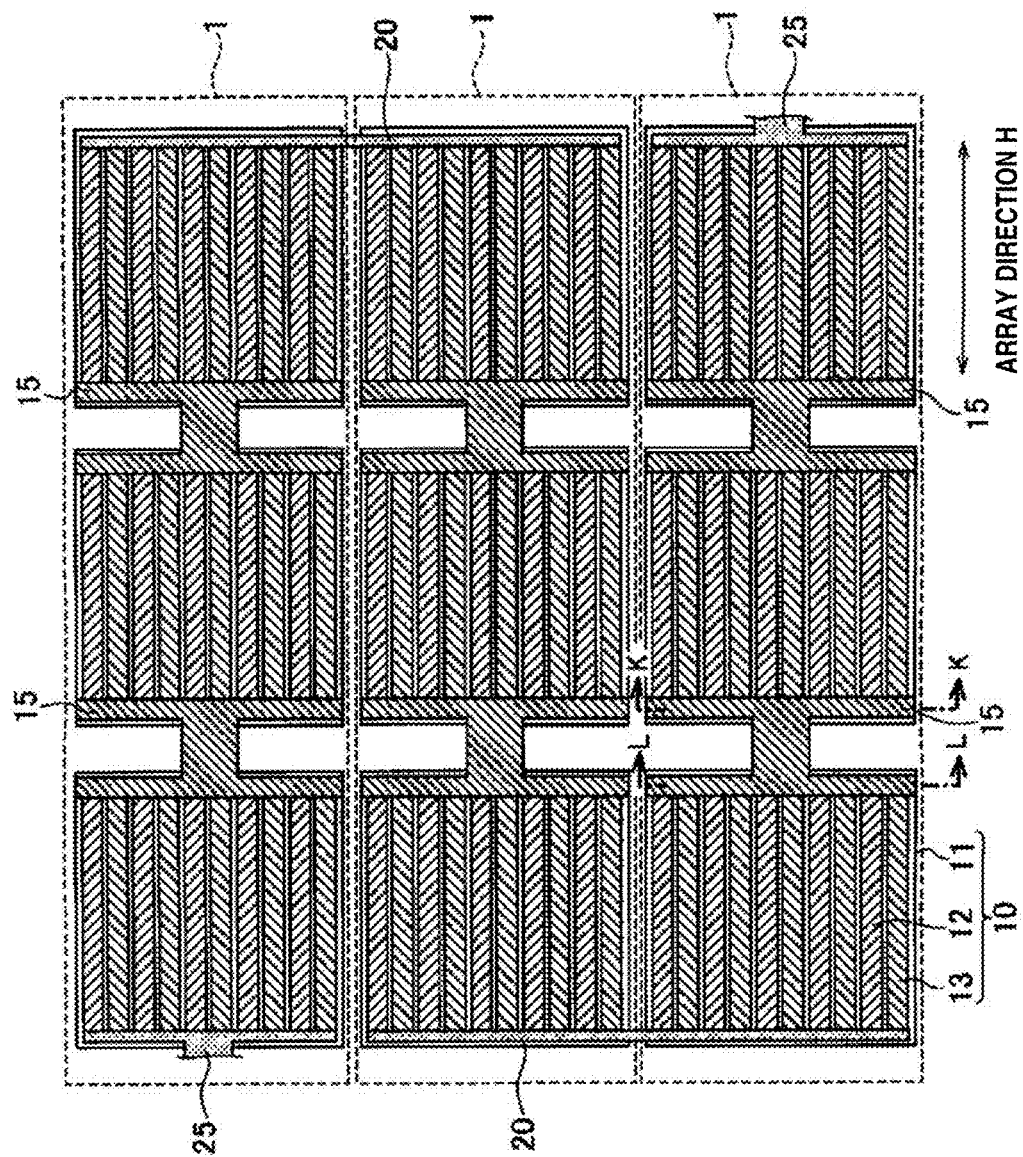
FIG. 2 is a plan view from the back side of a plurality of solar cells 10 of a first embodiment.

A schematic configuration of a solar cell module in an embodiment of the invention is described by referring to FIG. 1 as follows. FIG. 1 is a side view illustrating a configuration of solar cell module 100 of a first embodiment. FIG. 2 is a plan view from the back side of a plurality of solar cells 10 of a first embodiment.

As shown in FIG. 1 and FIG. 2, solar cell module 100 includes: a plurality of solar cell strings 1; linking wiring member 20; a pair of protruding wiring members 25; Light-receiving surface protecting member 30; rear surface protecting member 40; and sealing material 50.

Sealing material 50 seals a plurality of solar cell strings 1 between light-receiving side protecting member 30 and rear surface protecting member 40. Each solar cell string 1 includes a plurality of solar cells 10 and a plurality of wiring members 15.

A plurality of solar cells 10 is arranged along indicated array direction H. Each solar cell is electrically connected to another by wiring member 15. As shown in FIG. 2, each solar cell 10 is a so-called back junction solar cell, wherein a plurality of n-type side electrodes 12 and p-type side electrodes 13 are formed on the back side of semiconductor substrate 11. Configuration of solar cell 10 is discussed below.

Wiring member 15 electrically connects each solar cell 10. Specifically, wiring member 15 connects a plurality of n-type side electrodes 12 in one solar cell 10; and a plurality of p-type side electrodes 13 in another neighboring solar cell 10.

As for wiring member 15, electrical conducting material, such as copper shaped into a thin metal plate or a strand can be used. The surface of such electrical conducting material also can be coated with soft electrical conducting materials, such as general Pb-free soldering (for example, $SnAg_{3.0}Cu_{0.5}$)

Linking wiring member 20 electrically connects each solar cell string 1 to the other. Specifically, linking wiring member 20 connects: a plurality of n-type side electrodes 12 of solar cell 10 located in one side of one solar cell string 1; and a plurality of p-type side electrodes 13 in another neighboring solar cell 10 located in one side of another neighboring solar cell string 1. Linking wiring member 20 is made of the same material as wiring member 20.

Protruding wiring member pair 25 takes electric current from a plurality of solar cell strings 1. One side of protruding wiring member pair 25 is connected to a plurality of n-type side electrodes 12 of solar cell 10 located in one side of a plurality of solar cell strings 1. The other side of protruding wiring member pair 25 is connected to a plurality of p-type side electrodes 13 of solar cell 10 located in the other side of a plurality of solar cell strings 1. Protruding wiring member pair 25 is made of the same material as wiring member 20.

Wiring member 15 in this embodiment is arranged over: a plurality of n-type side electrodes 12 and a plurality of p-type side electrodes 13 in one solar cell 10; a plurality of n-type side electrodes 12 and a plurality of p-type side electrodes 13 in another solar cell 10. Furthermore, linking wiring member 20 and protruding wiring member pair 25 are arranged over a plurality of n-type side electrodes 12 and a plurality of p-type side electrodes 13 in one solar cell 10.

Light-receiving surface protecting member 30 is arranged on the light-receiving side of sealing material 50. It protects the surface of solar cell module. Light-receiving surface protecting member 30 can be made of materials such as translucent water shielding glass or translucent plastic.

Rear surface protecting member 40 is arranged on the rear side of sealing material 50. It protects the rear side of solar cell module 100. As for rear surface protecting member 40, it may comprise resin film such as PET (Polyethylene Terephthalate) or laminate film, wherein metallic foil, such as Al foil, is layered between resin film layers.

Sealing material 50 seals a plurality of solar cells 10 between light-receiving side protecting member 30 and rear surface protecting member 40. As for sealing material 50, translucent resin such as EVA, EEA, PVB, silicon, urethane, acrylic and epoxy can be used.

In addition, Al frame can be attached on the outer circumference of solar cell module 100 configured as above.

(Configuration of a Solar Cell)

Figure 3:
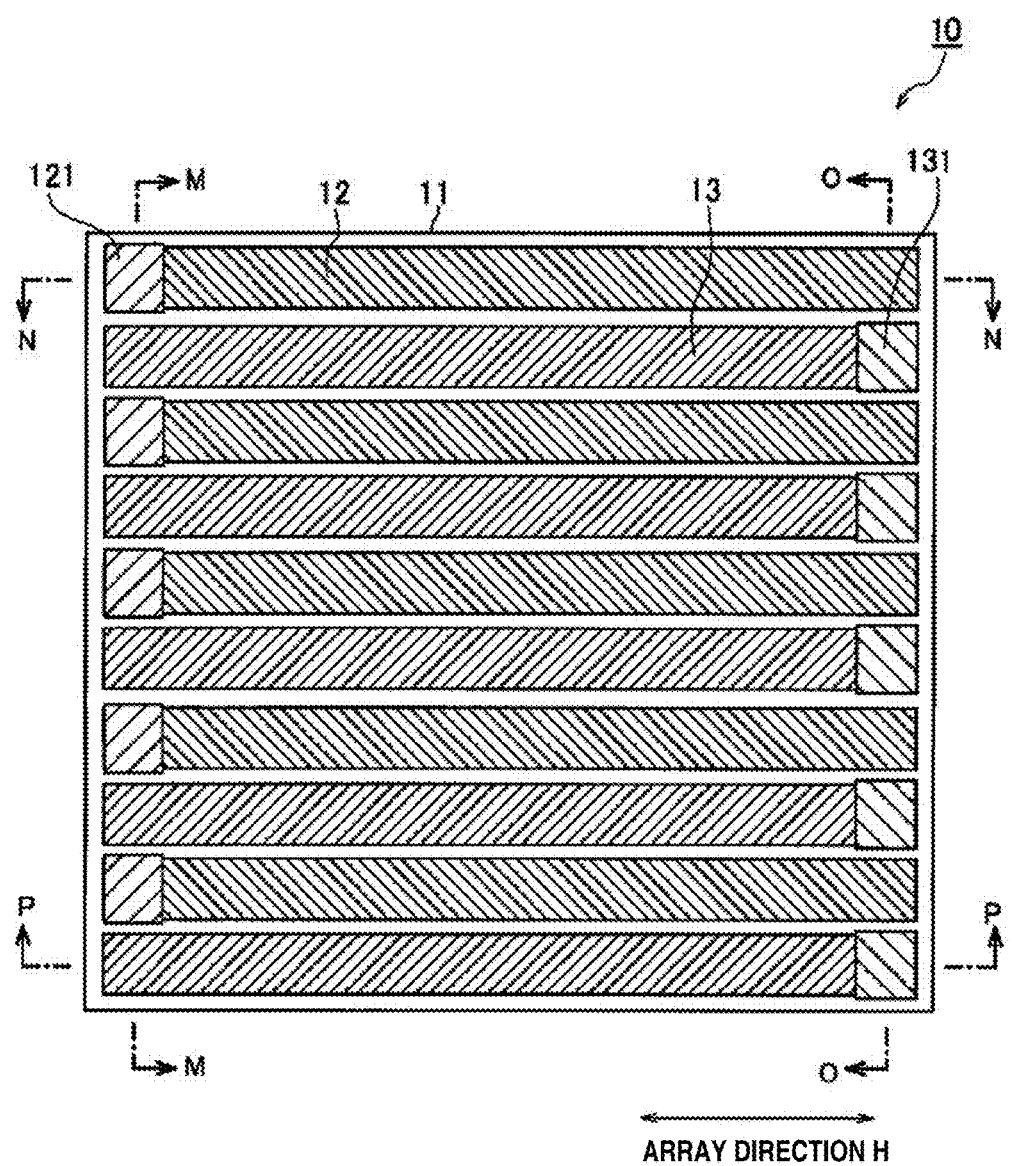
FIG. 3 is a plan view from the back side of solar cell 10 of a first embodiment.
Figure 6A:
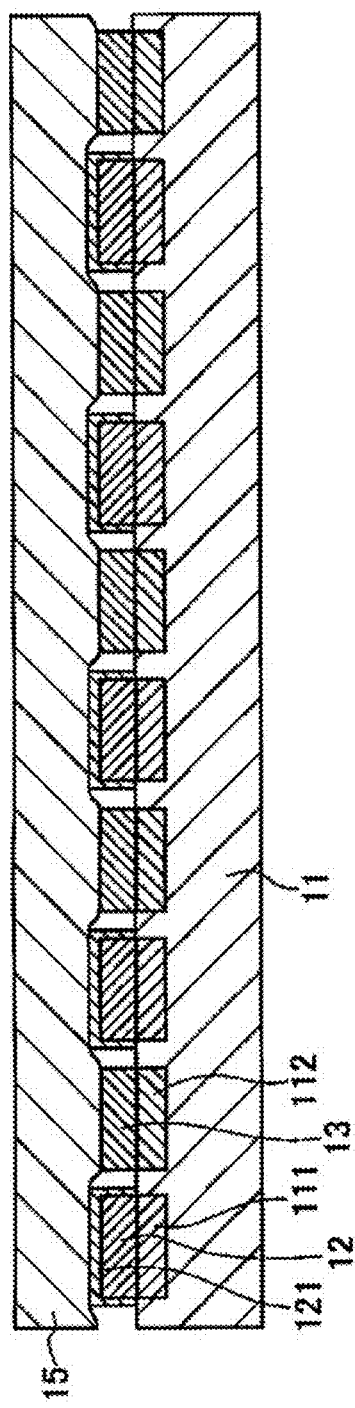
FIG. 6A is a cross-sectional view taken along sectional line L-L of FIG. 2.
Figure 6B:
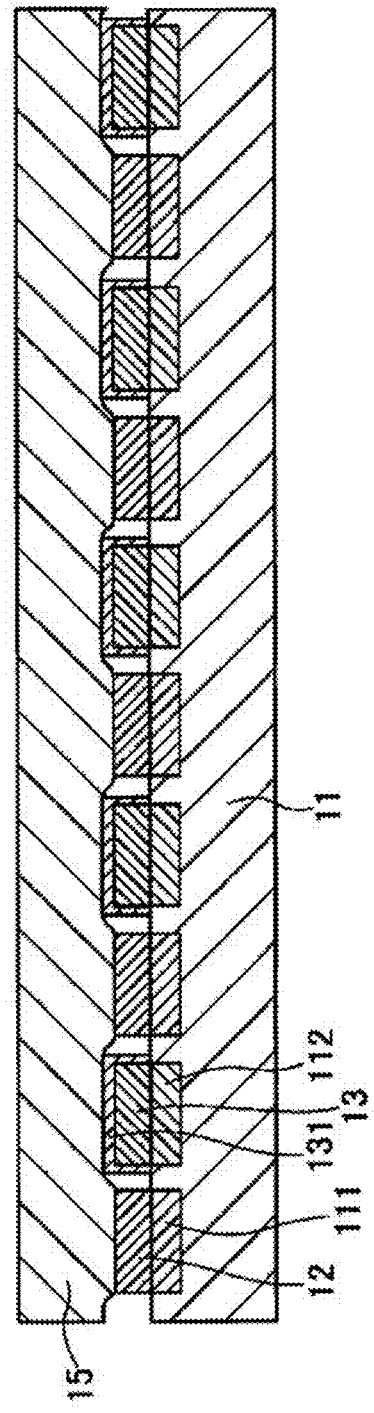
FIG. 6B is a cross-sectional view taken along sectional line K-K of FIG. 2.

A schematic configuration of solar cell 10 in an embodiment of the invention is described as follows by referring to the drawings. FIG. 3 is a plan view from the back side of solar cell 10 of an embodiment. FIG. 4A is a cross-sectional view taken along sectional line M-M of FIG. 3. FIG. 4B is a cross-sectional view taken along sectional line N-N of FIG. 3. FIG. 5A is a cross-sectional view taken along sectional line O-O of FIG. 3. FIG. 5B is a cross-sectional view taken along sectional line P-P of FIG. 3. FIG. 6A is a cross-sectional view taken along sectional line L-L of FIG. 2. FIG. 6B is a cross-sectional view taken along sectional line K-K of FIG. 2.

As shown in FIG. 3 to FIG. 5, solar cell 10 includes: semiconductor substrate 11, n-type side electrode 12, p-type side electrode 13, n-type side cover 121 and p-type side cover 131.

Semiconductor substrate 11 has a light-receiving surface to receive solar light and rear surface on the opposing side from the light-receiving surface. Semiconductor substrate 11 can be made of: single-crystal Si, which has n-type or r-type conductivity, crystalline semiconductor materials such as polycrystalline Si, and general semiconductor materials, such as chemical compound semiconductor materials, for example, GaAs and InP. As shown in FIG. 4 and FIG. 5, semiconductor substrate 11 includes n-doped region 111 and p-doped region 112 formed on the opposing side. Photogenerated carriers are generated inside from solar light received on light-receiving surface. Photogenerated carrier indicates electron and positive holes that are generated by semiconductor substrate 11 from its solar light absorption.

N-doped region 111 is a concentrated n-type diffusion region, which is formed by doping of an impure substance (such as phosphorus) on the back surface of semiconductor substrate 11. Electrons generated in semiconductor substrate 11 are gathered in n-doped region 111. P-doped region 112 is a concentrated p-type diffusion region, which is formed by doping of an impure substance (such as boron or aluminum) on the back surface of semiconductor substrate 11. Positive holes generated in semiconductor substrate 11 are gathered in p-doped region 112.

N-type side electrode 12 is a collecting electrode, which collects electrons gathered around n-doped region 111. As shown FIG. 3, n-type side electrode 12 is formed along array direction H. P-type side electrode 13 is a collecting electrode, which collects positive holes gathered around p-doped region 112. As shown FIG. 3, p-type side electrode 13 is formed along n-type side electrode 12. Further configurations of respective electrodes are discussed below.

N-type side cover 121 covers one edge of n-type side electrode 12. Wiring member 15 is arranged above n-type side cover 121. Therefore, the surface of n-type side electrode 12 facing wiring member 15 is covered by n-type side cover 121. Furthermore, n-type side cover 121 is made of commonly used insulating material, such as insulating resin. Therefore, n-type side cover 121 electrically separates n-type side electrode 12 and wiring member 15. Additionally, in this embodiment, n-type side cover 121 covers the side wall of one edge of n-type side electrode 12 as shown in FIGS. 4A and 4B.

P-type side cover 131 covers one edge of p-type side electrode 13. Wiring member 15 is arranged on p-type side cover 131. Therefore, the surface of p-type side electrode 13 facing wiring member 15 is covered by p-type side cover 131. Furthermore, p-type side cover 131 is made of commonly used insulating material, such as insulating resin. Therefore, p-type side cover 131 electrically separates p-type side electrode 13 and wiring member 15. Additionally, in this embodiment, p-type side cover 131 covers the side wall of the edge of p-type side electrode 13 as shown FIGS. 5A and 5B.

Here, n-type side cover 121 is formed on one edge of each solar cell 10 and p-type side cover 131 is formed on the other edge of each solar cell 10 along array direction H. That is to say, n-type side cover 121 and p-type side cover 131 are not formed on the neighboring parts next to each other. Hence, as shown FIG. 6A, wiring member 15 can be electrically separated from n-type side electrode 12 of one solar cell 10, while it is electrically connected to p-type side electrode 13 of one solar cell 10. On the other hand, as shown FIG. 6B, wiring member 15 can be electrically connected to n-type side electrode 12 of another solar cell 10, while it is electrically separated from p-type side electrode 13 of another solar cell 10.

(Configuration of Each Electrode)

Figure 7A:
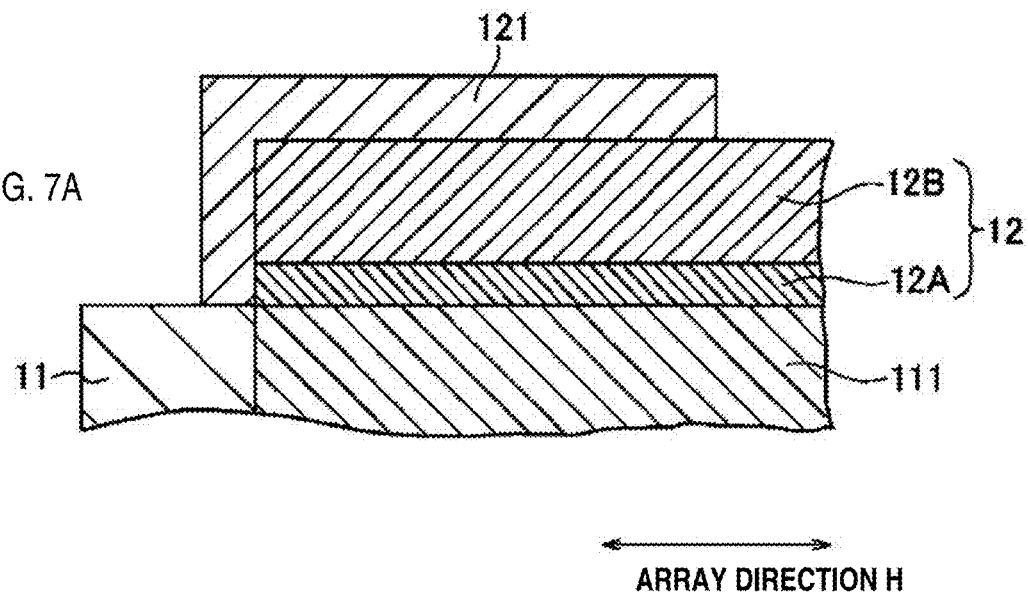
FIG. 7A is an enlarged sectional view showing construction of n-type side electrode 12.
Figure 7B:
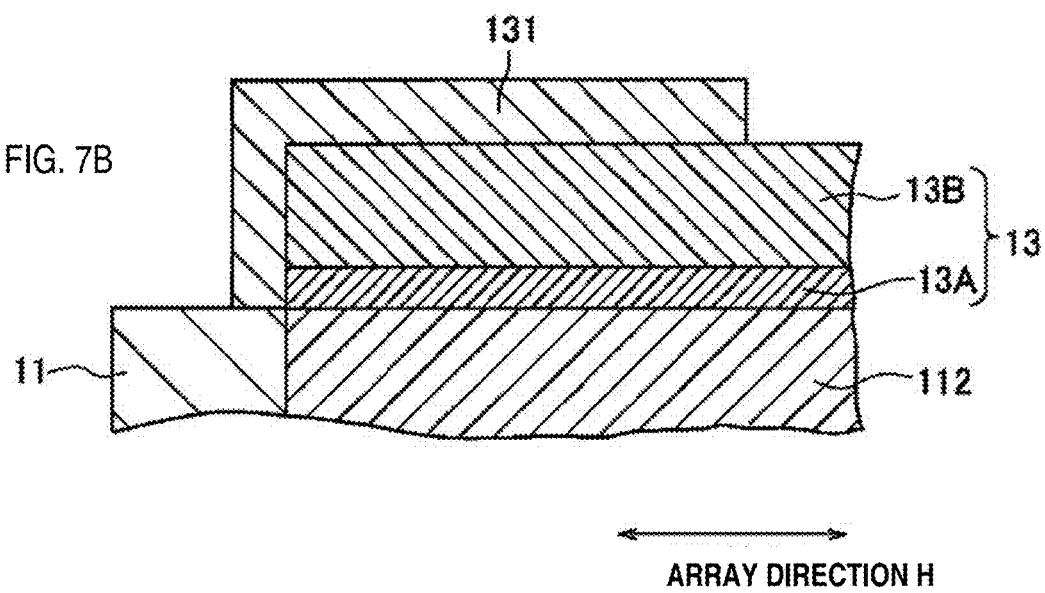
FIG. 7B is an enlarged sectional view showing construction of p-type side electrode 13.

Next, a schematic configuration of each electrode in this embodiment of the invention is described as follows by referring to the drawings. FIG. 7A is an enlarged sectional view showing construction of n-type side electrode 12. FIG. 7B is an enlarged sectional view showing construction of p-type side electrode 13.

As shown in FIG. 7A, n-type side electrode 12 includes first conductive layer 12A and second conductive layer 12B. First conductive layer 12A is formed on n-doped region 111 by PVD method, such as sputter technique or vapor-deposition technique. First conductive layer 12A is a transparent conducting layer formed by oxide such as In, Zn, Sn, Ti and W. Second conductive layer 12B is formed above first conductive layer 12A by using sputter technique, printing process or dispensing method. For example, second conductive layer 12B can be formed by following: sputtering silver; printing conductive paste such as resin conductive paste or sintered conductive paste.

As shown in FIG. 7A, n-type side cover 121 covers the side surface of first conductive layer 12A and second conductive layer 12B and top surface of one edge of second conductive layer 12B.

As shown in FIG. 7B, p-type side electrode 13 has first conductive layer 13A and second conductive layer 13B. First conductive layer 13A is formed above p-doped region 112 by PVD method such as sputter technique or vapor-deposition technique. First conductive layer 13A is a transparent conducting layer formed by oxide such as In, Zn, Sn, Ti and W. Second conductive layer 13B is formed above first conductive layer 13A by using sputter technique, printing process or dispensing method. For example, second conductive layer 13B can be formed by following: sputtering silver; printing conductive paste such as resin conductive paste and sintered conductive paste.

As shown in FIG. 7B, p-type side cover 131 covers side surface of first conductive layer 13A and second conductive layer 13B and top surface of one edge of second conductive layer 13B.

(Operation and Effect)

In solar cell module 100 of the embodiment, wiring member 15 is arranged over each n-type side electrode 12 and each p-type side electrode 13 in one solar cell 10 as well as each n-type side electrode 12 and each p-type side electrode 13 in an adjacent solar cell 10. Among the surface regions of a plurality of n-type side electrodes 12 of one solar cell 10, surface region facing wiring member 15 is covered by n-type side cover 121. Among the surface part of a plurality of p-type side electrodes 13 of one solar cell 10, surface part facing wiring member 15 is covered by p-type side cover 131.

As described above, each n-type side electrode 12 of one solar cell 10 and wiring member 15 are electrically separated by n-type side cover 121. Each p-type side electrode 13 of another solar cell 10 and wiring member 15 can be electrically separated by p-type side cover 131. Therefore, wiring member 15 can electrically connect to each p-type side electrode 13 of one solar cell 10 and each n-type side electrode 12 of another solar cell 10. As a result, each solar cell 10 does not need to have a connecting electrode to connect wiring member 15. Thus, it can prevent degradation of photogenerated carrier collection efficiency.

Furthermore in this embodiment, n-type side cover 121 covers a side surface of an edge part of each n-type side electrode 12 in one solar cell 10. Hence, it can electrically separate each n-type side electrode 12 and wiring member 15 effectively. Similarly, p-type side cover 131 covers a side surface of an edge part of each p-type side electrode 13 in another solar cell 10. Hence, it can electrically separate each p-type side electrode 13 and wiring member 15 effectively.

Second Embodiment

Next, with reference to the drawings, a second embodiment is described. A solar cell module in this embodiment has a similar configuration as above-described solar cell module 100 in the first embodiment. (referred to FIG. 1 and FIG. 2) In the following description, differences between the second embodiment and above-described first embodiment are chiefly described.

(Configuration of a Solar Cell)

FIG. 8A is a cross-sectional view taken along sectional line L-L of FIG. 2. FIG. 8B is a cross-sectional view taken along sectional line K-K of FIG. 2.

As shown in FIG. 8A, illustrating one solar cell 10, $\alpha_{12}$ indicates the thickness of the part of each n-type side electrode 12, which is facing wiring member 15. $\beta_{13}$ indicates the thickness of the part of each p-type side electrode 13, which is facing wiring member 15. Thickness $\alpha_{12}$ is thinner than the thickness $\beta_{13}$. Furthermore, thickness $\beta_{13}$ is greater than total thickness of $\alpha_{121}$ and thickness $\alpha_{12}$ of n-type side cover 121. Therefore, wiring member 15 does not have a contact with n-type side cover 121.

As shown in FIG. 8B, illustrating another solar cell 10, $\alpha_{13}$ indicates the thickness of the part of each p-type side electrode 13, which is facing wiring member 15. $\beta_{12}$ indicates the thickness of the part of each n-type side electrode 12, which is facing wiring member 15. Thickness $\alpha_{13}$ is thinner than the thickness $\beta_{12}$. Furthermore, thickness $\beta_{12}$ is greater than total thickness of $\alpha_{131}$ and thickness $\alpha_{13}$ of p-type side cover 131. Therefore, wiring member 15 does not have a contact with p-type side cover 131.

(Configuration of Each Electrode)

Figure 9A:
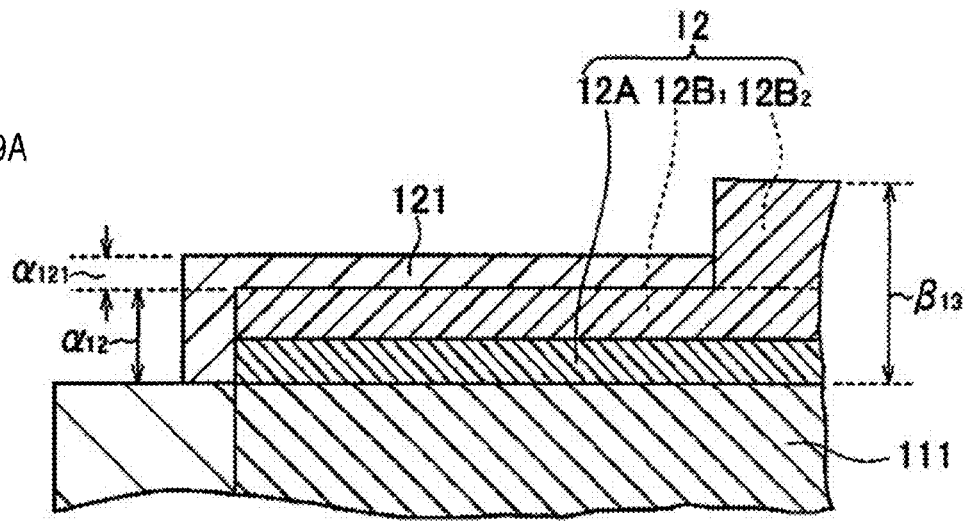
FIG. 9A is an enlarged sectional view showing construction of n-type side electrode 12.
Figure 9B:
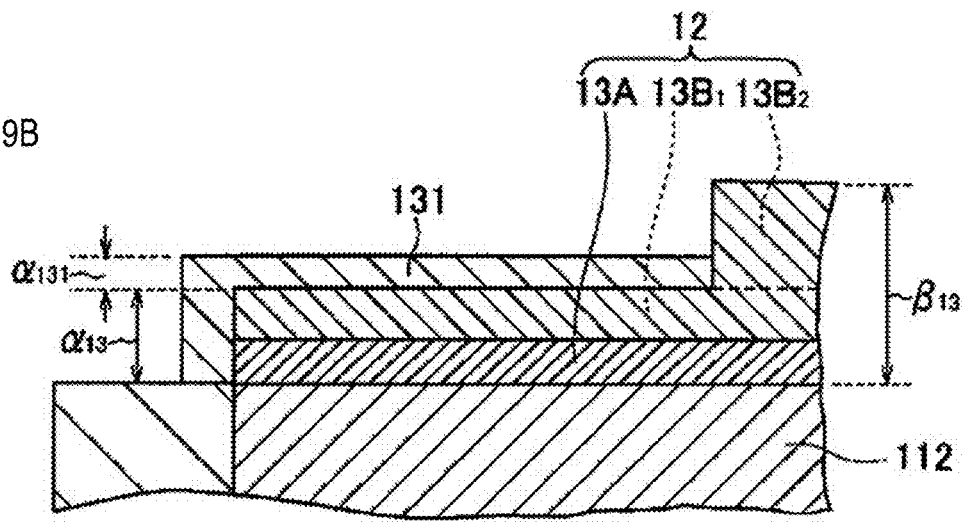
FIG. 9B is an enlarged sectional view showing construction of p-type side electrode 13.

Next, a schematic configuration of each electrode in a second embodiment is described by referring to the drawings as follows. FIG. 9A is an enlarged sectional view showing construction of n-type side electrode 12. FIG. 9B is an enlarged sectional view showing construction of p-type side electrode 13.

As shown in FIG. 9A, n-type side electrode 12 has first conductive layer 12A and second conductive layer 12B. Second conductive layer 12B includes lower side conductive layer 12B$_1$ and upper side conductive layer 12B$_2$. Lower side conductive layer 12B$_1$ can be formed by printing resin conductive paste or sintered conductive paste above first conductive layer 12A. Upper side conductive layer 12B$_2$ can be formed by printing resin conductive paste and sintered conductive paste on lower side conductive layer 12B$_1$.

The total thickness of the first conductive layer 12A and lower conductive layer 12B$_1$ is the same as the thickness $\alpha_{12}$ of the part facing wiring member 15 of n-type side electrode 12. In the embodiment shown in FIG. 9A, the total thickness of n-type side cover 121 $\alpha_{131}$ and $\alpha_{13}$ is smaller than the thickness $\beta_{12}$ of the part which is not facing wiring member 15.

As shown in FIG. 9B, p-type side electrode 13 has first conductive layer 13A and second conductive layer 13B. Second conductive layer 13B includes lower side conductive layer 13B$_1$ and upper side conductive layer 13B$_2$. Lower side conductive layer 13B$_1$ can be formed by printing resin conductive paste or sintered conductive paste on first conductive layer 13A. Upper side conductive layer 13B$_2$ can be formed by printing resin conductive paste and sintered conductive paste on lower side conductive layer 13B$_1$.

The total thickness of the first conductive layer 13A and lower conductive layer 13B$_1$ is the same as the thickness $\alpha_{13}$ of the part facing wiring member 15 of p-type side electrode 12. In the embodiment shown in FIG. 9B, total thickness of n-type side cover 121 $\alpha_{131}$ and $\alpha_{13}$ is smaller than the thickness $\beta_{13}$ of the part which is not facing wiring member 15.

(Operation and Effect)

In one solar cell 10 in this embodiment, thickness $\alpha_{12}$ of each n-type side electrode 12, which is facing wiring member 15, is thinner than thickness $\beta_{13}$ of each p-type side electrode 13, which is facing wiring member 15.

Therefore, each p-type side electrode 13 and wiring member 15 can be easily connected. Especially when thickness $\beta_{13}$ is greater than total thickness of $\alpha_{121}$ and thickness $\alpha_{12}$ of n-type side cover 121, wiring member 15 does not have a contact with n-type side cover 121. Therefore, wiring member 15 can be connected to each p-type side electrode 13 without clamping wiring member 15 against each n-type side electrode 12.

Similarly, in another solar cell 10, thickness $\alpha_{13}$ of each p-type side electrode 13, which is facing wiring member 15, is thinner than thickness $\beta_{12}$ of each n-type side electrode 12, which is facing wiring member 15.

Therefore, each n-type side electrode 12 and wiring member 15 can be easily connected. Especially when thickness $\beta_{12}$ is greater than total thickness of $\alpha_{131}$ and thickness $\alpha_{13}$ of n-type side cover 131, wiring member 15 does not have a contact with each p-type side cover 131. Therefore, wiring member 15 can be connected to each n-type side electrode 12 without clamping wiring member 15 against each p-type side electrode 13.

Other Embodiments

The invention is described as the above-described embodiments. However, the descriptions and drawings constituting a part of this disclosure do not limit the invention. Those in the art can develop various modifications on the embodiments, working examples and operating technology from disclosure of the invention.

Figure 10:
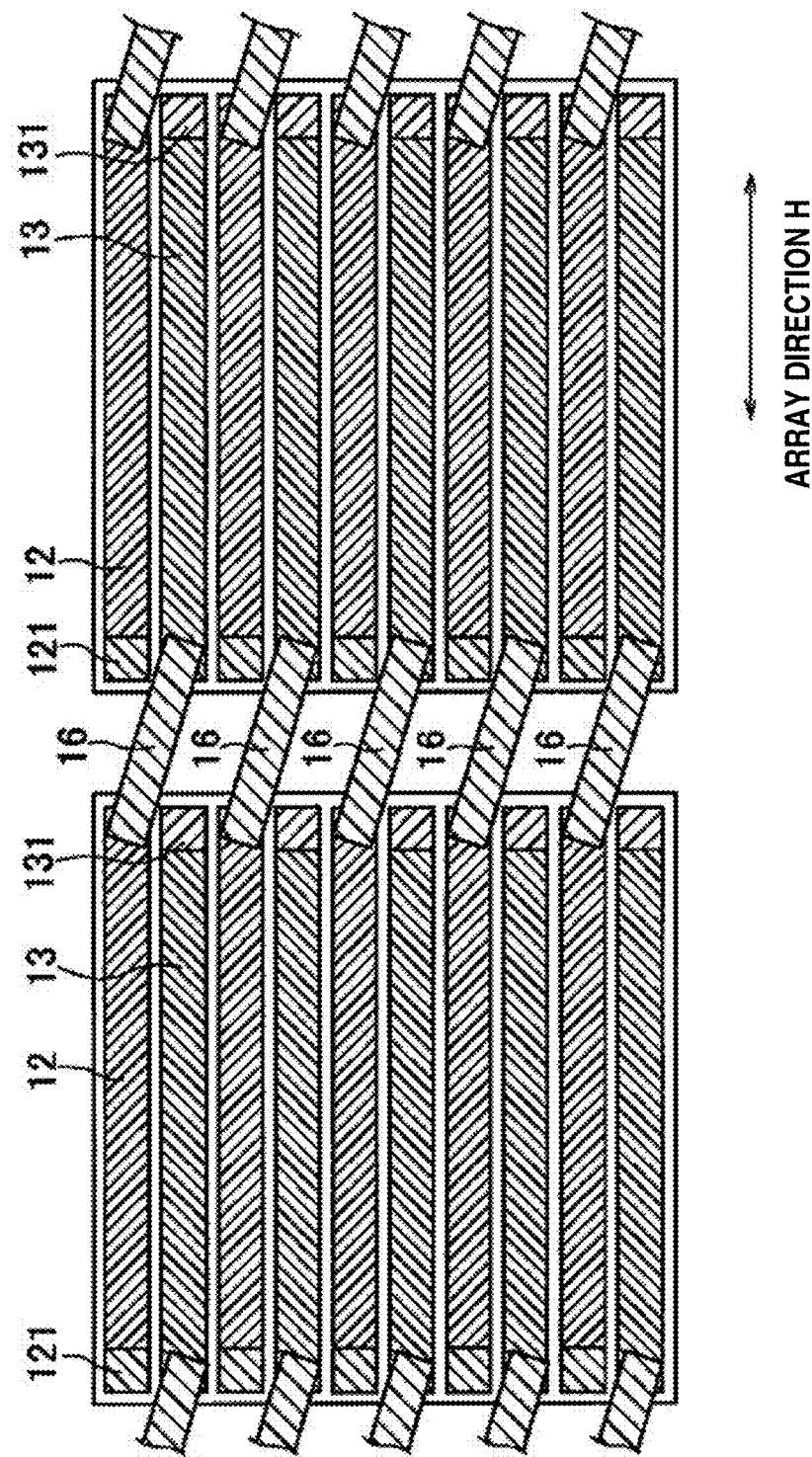
FIG. 10 is a diagram showing other construction of wiring member in an embodiment.

For example, in the above-mentioned embodiments, descriptions have been given that one solar cell 10 and another solar cell 10 are electrically connected with wiring member 15. However, the configuration is not limited to above example. As shown in FIG. 10, for example, one solar cell 10 and another solar cell 10 can be electrically connected with a plurality of wiring member 16. Specifically, each wiring member 16 connects between n-type side electrode 12 in one solar cell 10 and p-type side electrode 13 in another solar cell 10. Each wiring member 16 is electrically separated from p-type side electrode 13 in one solar cell 10 by p-type side cover 131. Furthermore, each wiring member 16 is electrically separated from n-type side electrode 12 in another solar cell 10 by n-type side cover 121. As described above, the invention is effective in the case of connecting one n-type side electrode 12 and one p-type side electrode 13 by one wiring member 16.

Figure 11:
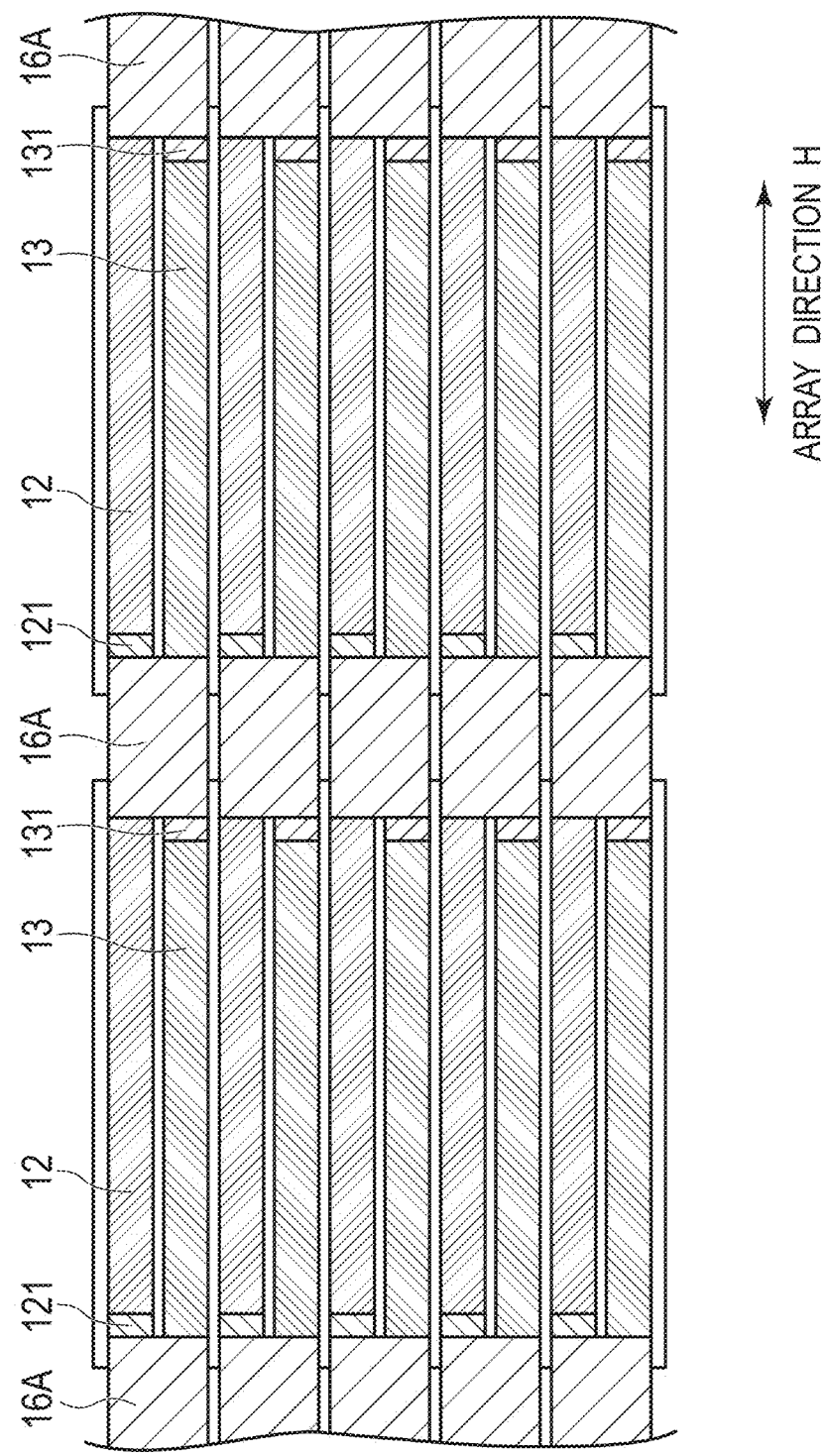
FIG. 11 is a diagram showing other construction of wiring member in an embodiment.

Furthermore, as shown in FIG. 11, a plurality of wiring member 16A can be used to connect electrically. Specifically, each wiring member 16A connects between n-type side electrode 12 in one solar cell 10 and p-type side electrode 13 in another solar cell 10. Each wiring member 16A is arranged over n-type side electrode 12 and p-type side electrode 13, respectively. Each wiring member 16A is electrically separated from p-type side electrode 13 in one solar cell 10 by p-type side cover 131. Furthermore, each wiring member 16A is electrically separated from n-type side electrode 12 in another solar cell 10 by n-type side cover 121. As described above, the invention is effective in the case of connecting one n-type side electrode 12 and one p-type side electrode 13 by one wiring member 16.

Figure 12:
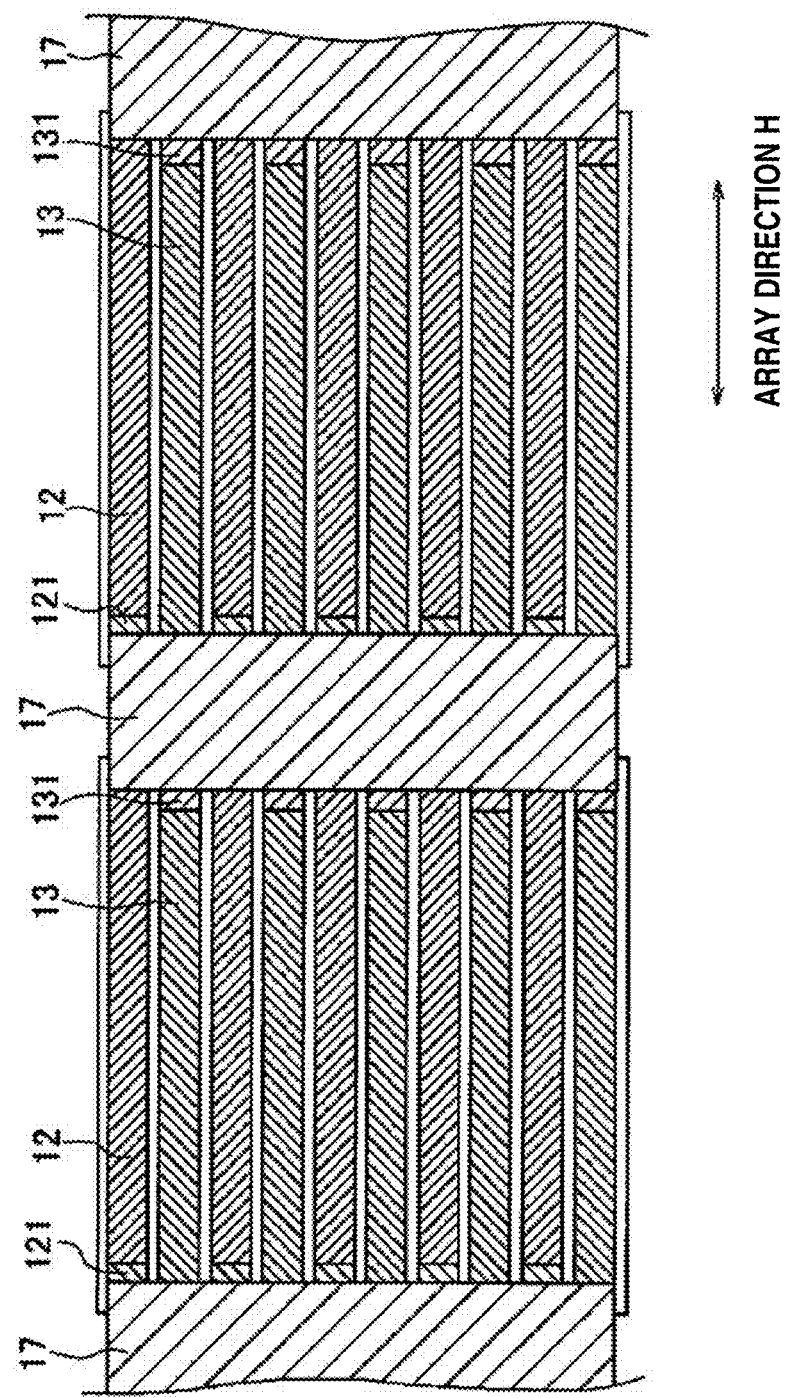
FIG. 12 is a diagram showing other construction of wiring member in an embodiment.

Furthermore, in the above-described embodiments, one solar cell 10 and another solar cell 10 are connected by H-shaped wiring member 15. However, it is not limited to this configuration. For example, as shown in FIG. 12, one solar cell 10 and another solar cell 10 can be connected by plate shaped wiring member 17.

Furthermore, in the above-described embodiments, five lines of each n-type side electrode 12 and each p-type side electrode 13 are used. However, it is not limited to this configuration. For example, in a case when the size of semiconductor substrate 11 is approximately 100 mm square, about sixty lines of each n-type side electrode 12 and each p-type side electrode 13 can be formed, respectively.

Furthermore, in the above-described first embodiments, n-type side cover 121 covers the side surface of one edge of n-type side electrode 12. It is satisfactory if n-type side cover 121 covers the upper surface of one edge of n-type side electrode 12. Furthermore, p-type side cover 131 covers the side surface of one edge of p-type side electrode 13. It is satisfactory if p-type side cover 131 covers the upper surface of one edge of p-type side electrode 13.

Furthermore, in the above-described second embodiments, n-type side cover 121 is formed on lower conductive layer 12B$_1$. However, n-type side cover 121 can be formed on first conductive layer 12A (transparent conductive film).

Furthermore, although it is not mentioned expressly in abovementioned embodiments, n-type side cover 121 can be formed on n-type side electrode 12 or on the surface of wiring member 15 during the manufacturing process. It is suitable as long as n-type side cover 121 is formed between n-type side electrode 12 and wiring member 15. Similarly, p-type side cover 131 can be formed on p-type side electrode 13 or on the surface of wiring member 15 during the manufacturing process. It is suitable as long as p-type side cover 131 is formed between p-type side electrode 13 and wiring member 15.

As described above, naturally the scope of invention includes various embodiments that are not listed in here. Hence, the technology scope of the invention is indicated by above descriptions and the adequate scope of the invention, and it can be only specified by claim matters of the invention.

Hereinafter, working examples of solar cell module of embodiments above are described in detail. However, the invention is not limited to the working examples described below and those skilled in the art are able to add various changes to create other embodiments without departing from the scope of the invention.

Working Example 1

Firstly, n-type single-crystalline silicon substrate is prepared. It is formed approximately 100 mm square and thickness 200 μm and its resistivity is 0.1 Ωcm.

Next, by using screen printing method, n-type diffusing agent paste (containing phosphorus) and p-type diffusing agent paste (containing boron) are printed in lines, each agent forming 41 lines on the back surface of n-type single-crystalline silicon substrate, respectively. Further, by applying thermal diffusion treatment, 41 lines of each of n-type region and p-type region having 0.8 mm in width and 98 mm in length are formed at intervals of 2.4 mm.

Next, transparent conducting layer (ITO layer) is formed on respective n-doped region and p-doped region by sputtering method. After silver paste is printed on ITO layer by using screen printing method, n-type side electrode and p-type side electrode are formed. The dimension of each electrode is 0.8 mm in width, 98 mm in length and 30 μm in thickness. Then n-type side electrode and p-type side electrode are hardened by heating at 150° C. for 30 minutes.

Next, one edge of n-type side electrode is covered by polyimide resin by dispensing method. To be precise, n-type side covered part, 1.2 mm in width, 3 mm in length and 10 μm in thickness, is formed to cover the surface of one edge of n-type side electrode Next, one edge of p-type side electrode is covered by polyimide resin by dispensing method. To be precise, p-type side covered part, 1.2 mm in width, 3 mm in length and 10 μm in thickness, is formed to cover the surface of one edge of n-type side electrode Next, n-type side cover and p-type side cover are hardened by heating at 200° C. for 5 minutes.

Next, 200 solar cells are created by repeating the above mentioned procedure. By connecting two solar cells, 100 solar cell pairs are created. To be precise, n-type side electrode in one solar cell and p-type side electrode in another solar cell are soldered with solder plated copper-foil. Dimension of solder plated copper-foil is 0.8 mm in width, 8 mm in length and 0.3 mm in thickness.

Working Example 2

In working example 2, thickness of silver paste, which is formed on n-type side cover above n-type side electrode, is formed 10 μm thinner than other surface area. Due to the fact that the thickness of n-type side cover is 10 μm; the surface of n-type side electrode and the surface of n-type side cover are even in thickness.

Similarly, thickness of silver paste, which is formed on p-type side cover above p-type side electrode, is formed 10 μm thinner than other surface area. Due to the fact that the thickness of p-type side cover is 10 μm; the surface of p-type side electrode and the surface of p-type side cover are even in thickness.

All other processes in working example 2 are the as above-described working example 1.

Working Example 3

In a working example 3, silver paste is not coated on the part of n-type side cover above n-type side electrode. Instead, n-type side covered part, 10 μm in thickness, is formed on ITO layer.

Similarly, silver paste is not coated on the part of p-type side cover above p-type side electrode. Instead, p-type side covered part, 10 μm in thickness, is formed on ITO layer.

All other processes in working example 3 is the same process as above-described working example 1.

Comparative Example

In a comparative example, n-type side cover and p-type side cover are not formed. All other processes in the comparative example are the same as in the above-described working example 1.

(Substantiated Short Circuit Incidence Rate)

Short circuit incidence rate is experimentally-substantiated using solar cell pairs of working example 1 to working example 3 and comparative example. In the result, short circuit incidence rate of comparative example is 5%. Namely, the short circuit incidents were found in 5 pairs of solar cells in comparative examples. It is due to solder plated copper-foil touching either p-type side electrode in one solar cell or n-type side electrode in another solar cell.

On the other hand, circuit incidence rates of working example 1 to working example 3 were 0%. It is due to the solder plated copper-foil being successfully electrically-separated from p-type side electrode of one solar cell by n-type side covered part, as well as electrically separated from n-type side electrode of another solar cell by p-type side covered part.

(Temperature Cycle Test)

Next, working example 1 and comparative example are tested with a temperature cycle test (JIS C8917). Photoelectric conversion efficiency before and after the test of both examples are compared. The temperature cycle test is in compliance with JIS standard; 200 cycles are tested. Each cycle has temperature change from high temperature (90° C.) to low temperature (−40° C.) or low temperature to high temperature. Furthermore, the solar cell module has a configuration wherein 5 solar cell pairs are sealed between glass substrate and PET film. 10 sets of such solar cell module are created for working example and comparative examples, respectively.

After the temperature cycle test, degradation rate of photoelectric conversion efficiency of solar cell module of comparative example is approximately 2%. On the other hand, degradation rate of photoelectric conversion efficiency of solar cell module of working example 1 is approximately 1%. Accordingly, it is confirmed that a solar cell module having sufficient weathering performance can be constructed even if the n-type side cover and the p-type side cover are formed on the n-type side electrode and the p-type side electrode respectively.

As described above, solar cell module in the embodiments can prevent degradation of collection efficiency of photo-generated carrier in the solar cell.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention. Cited references are specifically incorporated by reference in their entirety.

What is claimed is:

1. A solar cell module comprising:
a first solar cell;
a second solar cell electrically connected with the first solar cell and placed in an array direction with the first solar cell; and
a wiring member electrically connecting the first solar cell and the second solar cell,
wherein the first solar cell and the second solar cell each comprise:
a light-receiving surface;
a rear surface arranged on a back side of the light-receiving surface;
first-type electrodes each having a facing part and a connecting end on the rear surface, the facing part being positioned at an end opposite to the connecting end in the array direction;
second-type electrodes each having a facing part and a connecting end on the rear surface, the facing part being positioned at an end opposite to the connecting end in the array direction;
a first-type electrode insulating member arranged on the facing part of each of the first-type electrodes; and
a second-type electrode insulating member arranged on the facing part of each of the second-type electrodes, and
wherein
the thickness of the facing part of each of the first-type electrodes facing the wiring member in the first solar cell is thinner than the thickness of the connecting end of each of the second-type electrodes in the first solar cell such that the facing part of each of the first-type electrodes does not contact the wiring member in the first solar cell and the connecting end of each of the second-type electrodes connects the wiring member in the first solar cell,
the thickness of the facing part of each of the second-type electrodes facing the wiring member in the second solar cell is thinner than the thickness of the connecting end of each of the first-type electrodes in the second solar cell such that the facing part of each of the second-type electrodes does not contact the wiring member in the second solar cell and the connecting end of each of the first-type electrodes connects the wiring member in the second solar cell,
a portion of each of the first-type electrodes between the connecting end and the facing part thereof in the array direction has the same thickness as the thickness of the connecting end thereof, and the portion thereof does not connect the wiring member, and
a portion of each of the second-type electrodes between the connecting end and the facing part thereof in the array direction has the same thickness as the thickness of the connecting end thereof, and the portion thereof does not connect the wiring member.

2. The solar cell module of claim 1, wherein the first-type electrodes and the second-type electrodes are arranged alternately in the first solar cell and the first-type electrodes and the second type electrodes are arranged alternately in the second solar cell.

3. The solar cell module of claim 1, wherein
each first-type electrode insulating member is arranged on a first end side of the first solar cell in the array direction and each second-type electrode insulating member is arranged on a second end side of the first solar cell in the array direction.

4. The solar cell module of claim 1, wherein each second-type electrode insulating member and each first-type electrode insulating member are made essentially of polyimide resin.

5. The solar cell module of claim 1, wherein the first-type electrode insulating member covers an exposed side of each of the first-type electrodes.

6. The solar cell module of claim 1, wherein each of the first-type electrodes has n-type conductivity, and each of the second-type electrodes has p-type conductivity.

7. The solar cell module of claim 1, wherein the first-type electrodes has p-type conductivity, and each of the second-type electrodes has n-type conductivity.

8. The solar cell module of claim 1, wherein the width of the wiring member is greater than a distance between adjacent cells in the array direction.

9. The solar cell module of claim 1, wherein the wiring member has a flat-plate shape.

10. A solar cell module comprising:
a first solar cell;
a second solar cell electrically connected with the first solar cell and placed in an array direction with the first solar cell; and
a wiring member electrically connecting the first solar cell and the second solar cell,
wherein the first solar cell and the second solar cell each comprise:
a light-receiving surface;
a rear surface arranged on a back side of the light-receiving surface;
first-type electrodes each having a facing part and a connecting end on the rear surface, the facing part being positioned at an end opposite to the connecting end in the array direction;
second-type electrodes each having a facing part and a connecting end on the rear surface, the facing part being positioned at an end opposite to the connecting end in the array direction, the first-type electrodes and the second-type electrodes being arranged alternately and in parallel to each other;
a first-type electrode insulating member arranged on the facing part of each of the first-type electrodes but not on the facing part of each of the second-type electrodes; and
a second-type electrode insulating member arranged on the facing part of each of the second-type electrodes but not on the facing part of each of the first-type electrodes, and
wherein
the wiring member is arranged as a straight line over a first end side of the first-type electrodes and the second-type electrodes in the array direction,
the thickness of the facing part of each of the first-type electrodes facing the wiring member in the first solar cell is thinner than the thickness of the connecting end of each of the second-type electrodes in the first solar cell such that the facing part of each of the first-type electrodes does not contact the wiring member in the first solar cell and the connecting end of each of the second-type electrodes connects the wiring member in the first solar cell,
the thickness of the facing part of each of the second-type electrodes facing the wiring member in the second solar cell is thinner than the thickness of the connecting end of each of the first-type electrodes in the second solar cell such that the facing part of each of the second-type electrodes does not contact the wiring member in the second solar cell and the connecting end of each of the first-type electrodes connects the wiring member in the second solar cell,
a portion of each of the first-type electrodes between the connecting end and the facing part thereof in the array direction has the same thickness as the thickness of the connecting end thereof, and the portion thereof does not connect the wiring member, and
a portion of each of the second-type electrodes between the connecting end and the facing part thereof in the array direction has the same thickness as the thickness of the connecting end thereof, and the portion thereof does not connect the wiring member.

11. The solar cell module of claim 10, wherein each first-type electrode insulating member is arranged on the first end side of the first-type electrodes and each second-type electrode insulating member is arranged on a second end side of the second-type electrodes.

* * * * *